United States Patent [19]

Khambaty et al.

[11] Patent Number: 5,407,849
[45] Date of Patent: Apr. 18, 1995

[54] CMOS PROCESS AND CIRCUIT INCLUDING ZERO THRESHOLD TRANSISTORS

[75] Inventors: Moiz Khambaty, Sunnyvale; Corey D. Petersen, Pleasanton, both of Calif.

[73] Assignee: IMP, Inc., San Jose, Calif.

[21] Appl. No.: 902,914

[22] Filed: Jun. 23, 1992

[51] Int. Cl.$^6$ .......................... H01L 21/266
[52] U.S. Cl. ........................ 437/45; 437/30; 437/57; 148/DIG. 70
[58] Field of Search ............. 437/30, 34, 45, 70; 148/DIG. 34, DIG. 70

[56] References Cited

U.S. PATENT DOCUMENTS 4,422,885 12/1983 Brower et al. .................. 437/45
4,845,047 7/1989 Holloway et al. ............... 437/45
5,091,324 2/1992 Hsu et al. ....................... 437/45
5,270,235 12/1993 Ito ................................. 437/45

Primary Examiner—Brian E. Hearn
Assistant Examiner—C. Chaudhari
Attorney, Agent, or Firm—Majestic, Parsons, Siebert & Hsue

[57] ABSTRACT

A method of threshold adjust implantation which involves the implanting of some of the PMOS FETs' channels on a CMOS circuit so the PMOS FETs have a threshold voltage of substantially zero volts, the implanting involves an additional implantation of ions into the PMOS FETs' channels in addition to the implantation required to raise the PMOS FETs' threshold voltage from the native threshold voltage to the normal threshold voltage.

12 Claims, 3 Drawing Sheets

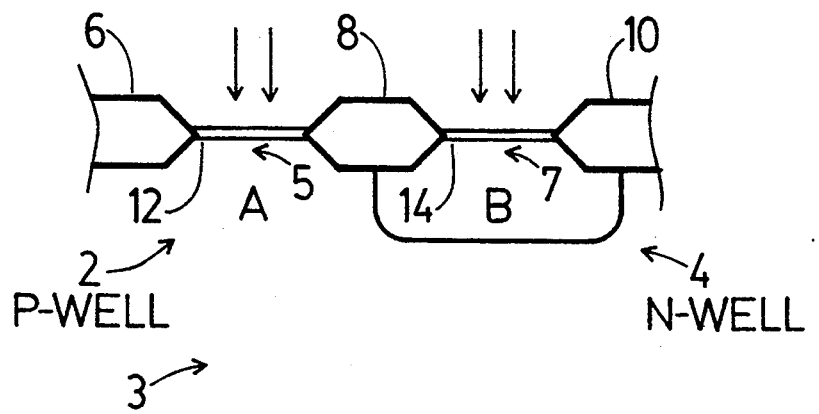
FIG._1.
PRIOR ART
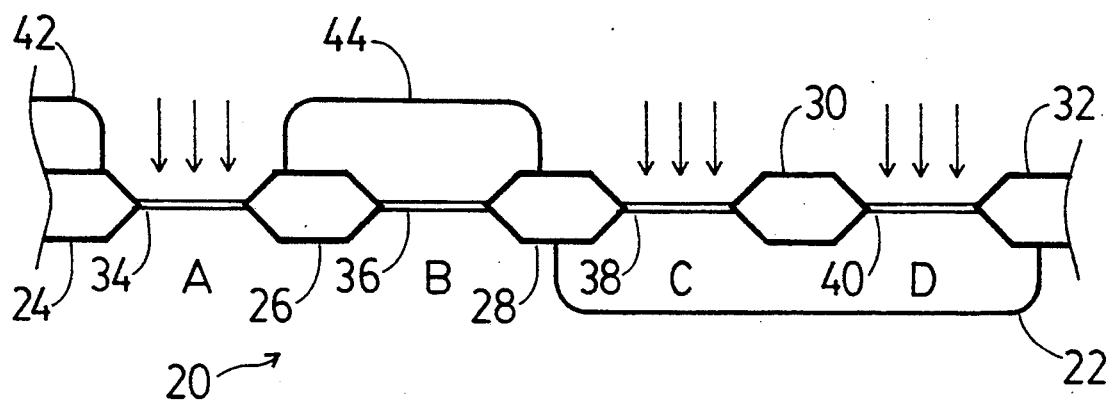
FIG._2.
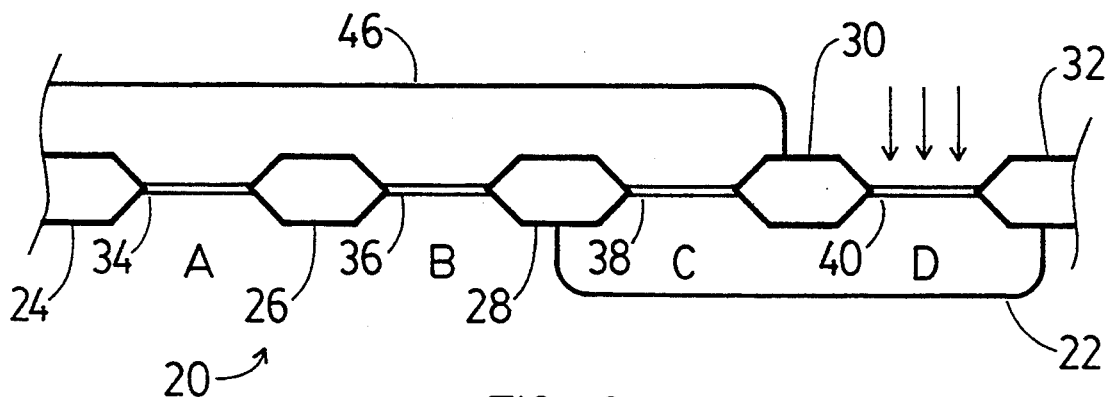
FIG._3.

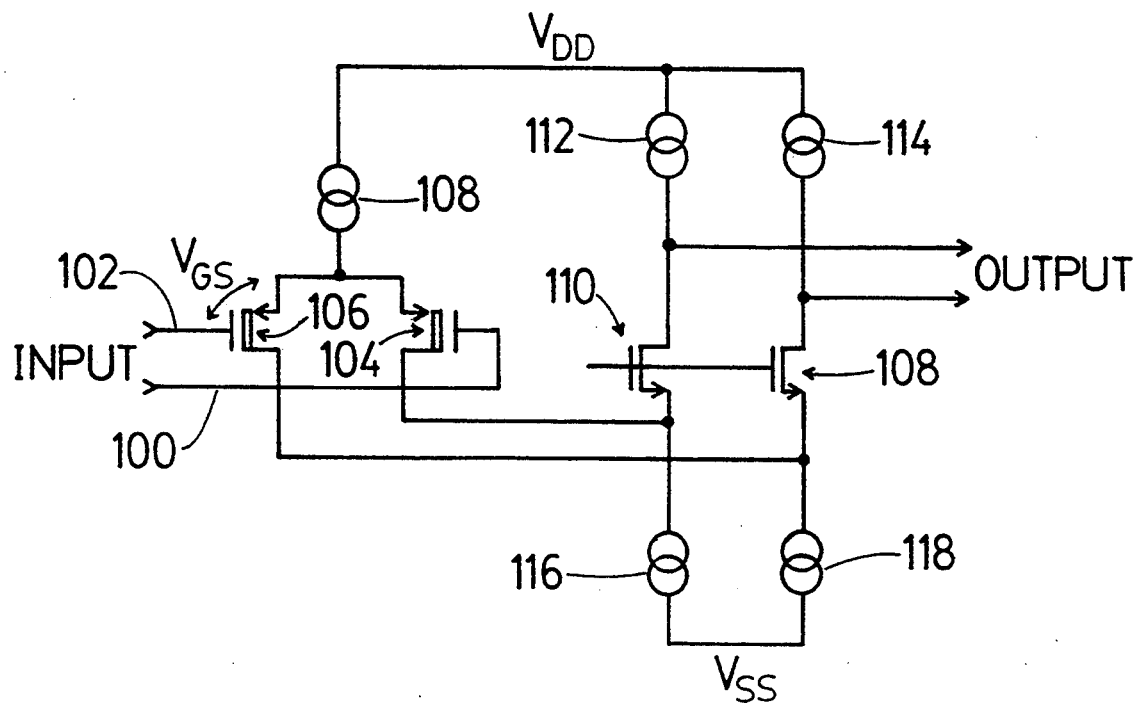
FIG._4.
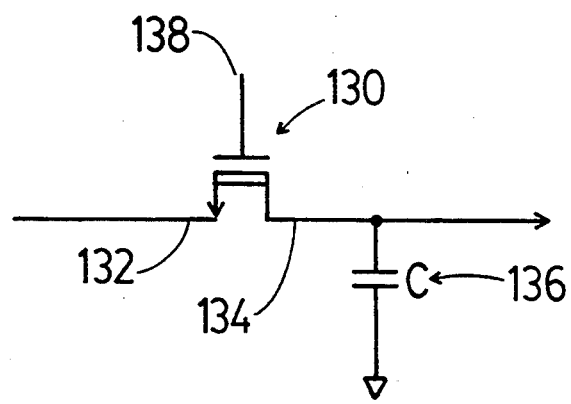
FIG._5.

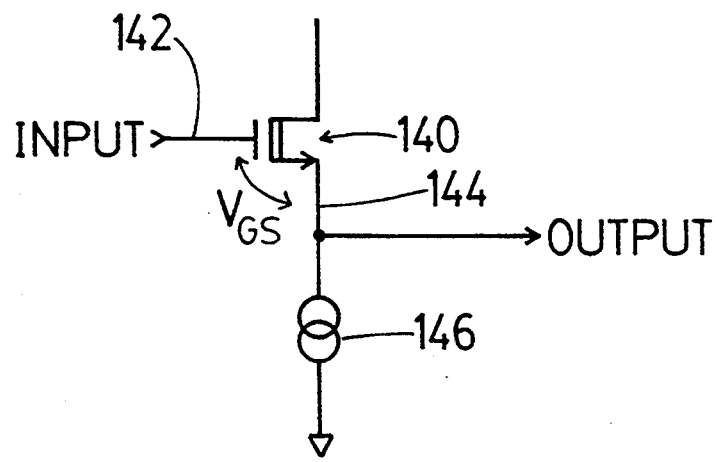
FIG._6.
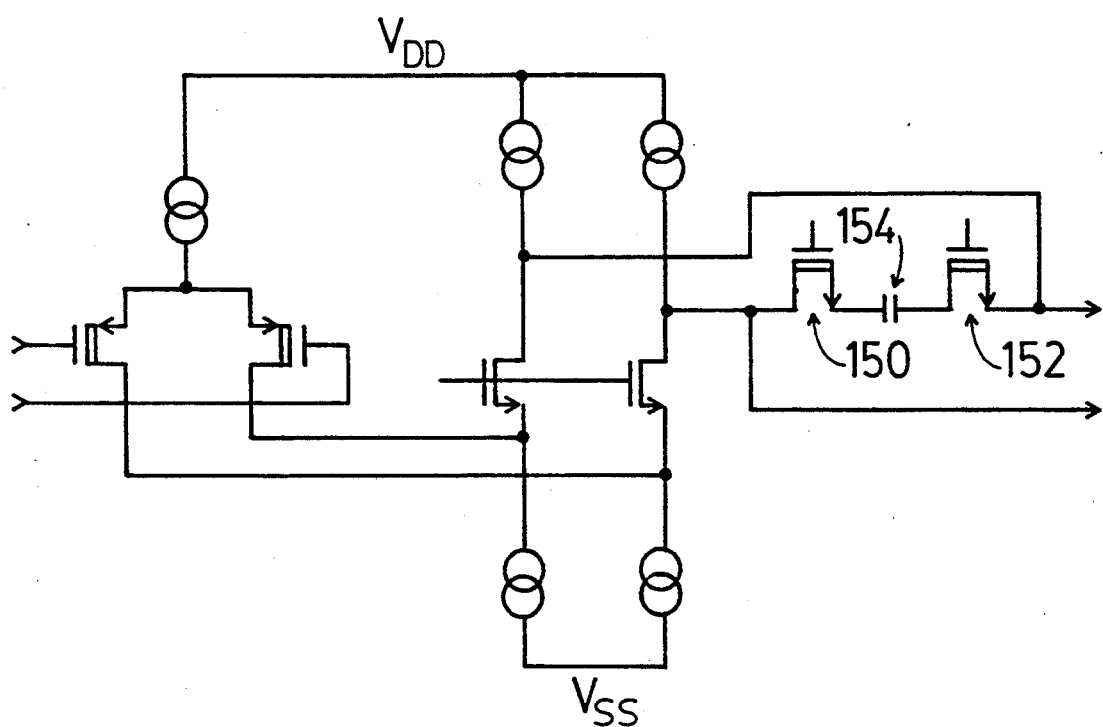
FIG._7.

CMOS PROCESS AND CIRCUIT INCLUDING ZERO THRESHOLD TRANSISTORS

BACKGROUND OF THE INVENTION

This invention relates to a process for manufacturing integrated circuits such as complementary metal oxide semiconductor (CMOS) circuits including P-channel field effect transistors (PMOS FETs) and N-channel field effect transistors (NMOS FETs) and resulting products. In the production of integrated circuits on semiconductor substrates, the threshold voltage $V_T$ is set by a threshold adjust implantation of a doped material into the FET's channels. The prior art threshold adjust implantation is described in FIG. 1. FIG. 1 shows p-well 2 and n-well 4 formed on a semiconductor substrate, field oxide regions 6, 8 and 10, and thin gate oxide layers 12 and 14 covering the channels.

In the threshold adjust implantation the voltage threshold $V_T$ of the FET being created is determined by the magnitude of the implantation in the regions 5 and 7 which will be the channels for the FETs.

If no threshold adjust implantation is done before the creation of the PMOS and NMOS FETs, the FETs' threshold voltage would be their native threshold voltage. In the prior art threshold adjust implantation for a 1.2 micron process, a boron ion implant dose of $9.5 \times 10^{11}$ Boron ions per cm$^2$ is typically done to both regions A and region B.

Due to the threshold adjust implantation, the PMOS FET with the channel in region B will have its threshold voltage raised from the PMOS native threshold voltage to the PMOS normal threshold voltage. At the same time, the NMOS FET with its channel in region A will have its threshold voltage raised from the NMOS native threshold voltage to the NMOS normal threshold voltage. In this manner, the PMOS and NMOS FETs with normal threshold voltages are created.

The prior art also includes the use of zero threshold voltage NMOS FETs. These zero threshold voltage NMOS FETs are merely NMOS FETs whose threshold voltage is the native threshold voltage for NMOS FETs. For NMOS FETs, the zero threshold voltage is the native threshold voltage.

The ranges of the normal and native threshold voltages for PMOS and NMOS FETs are discussed below in the detailed description section.

SUMMARY OF THE INVENTION

It is desired to have FETs which have a higher transconductance, lower noise, less excess bias required allowing for higher signal levels with less distortion, and lower resistance for a given gate voltage. Additionally, it is desired to have CMOS circuits that work with lower supply voltages. The reduction of the supply voltage for the CMOS circuits allows for a lower power use by the circuit and can allow for longer battery life. It has been found that for analog CMOS circuits, lowering the threshold voltage of the PMOS and NMOS FETs increases their dynamic range in order to counteract the decrease in the dynamic range which results from a reduction of the supply voltage from 5 volts to 3 volts.

In accordance with the principles of the present invention, the above and other objectives are realized by using a method of threshold adjust implantation which involves the implanting of some of the channels of PMOS FETs on an integrated circuit so that the PMOS FETs' threshold voltage is the zero threshold voltage. This implanting involves an additional implantation of ions into the PMOS FETs' channel in addition to the normal implant required to raise the PMOS FET's threshold voltage from the native threshold voltage to the normal threshold voltage. This additional implantation raises the threshold voltage of the PMOS FETs to the zero threshold voltage for PMOS FETs.

One preferred embodiment of this threshold adjust implantation uses a single implantation to raise the threshold voltage of the PMOS FETs from the native threshold voltage to the normal threshold voltage and raise the threshold voltage of the NMOS FETs from the native threshold voltage to the normal threshold voltage for NMOS FETs. Then a photoresist masking step is used to cover the FETs' channels except for some of the PMOS FETs' channels which are desired to have a zero threshold voltage. An additional implantation of ions raises the threshold voltage of some PMOS FETs from the native threshold voltage up to the zero threshold voltage. Photoresist masking may also be used before the first implant thereby masking some of the NMOS FETs' channels for both of the ion implantations so that the NMOS FET has a zero threshold voltage which is the native threshold voltage of an NMOS FET.

The invention also includes having an integrated circuit on a semiconductor substrate including at least one PMOS FET with a substantially zero threshold voltage.

BRIEF DESCRIPTION OF THE DRAWINGS

The above and other features and aspects of the present invention will become more apparent upon the reading of the following detailed description, in conjunction with the accompanied drawings, in which:

FIG. 1 is a cross-sectional view showing the channels for a PMOS and NMOS FET on a semiconductor substrate on which a prior art threshold adjust implantation is done;

FIG. 2 is a cross-sectional view showing a semiconductor substrate with NMOS and PMOS regions which will be formed into the NMOS and PMOS FETs on which the first ion implantation of the preferred embodiment of the present invention is done;

FIG. 3 is a cross-sectional view of a die which shows the NMOS and PMOS regions which will be formed into the NMOS and PMOS FETs and shows the second additional ion implantation of the preferred embodiment of the present invention;

FIG. 4 is a circuit diagram showing a folded cascode transconductance amplifier which uses zero threshold voltage PMOS FETs and normal voltage threshold NMOS FETs;

FIG. 5 is a circuit diagram of a switch made out of a zero threshold voltage NMOS FET connected to a load capacitor;

FIG. 6 is a circuit diagram showing a low offset source follower using a zero threshold voltage NMOS FET;

FIG. 7 is a circuit diagram showing a folded cascode transconductance amplifier similar to that shown in FIG. 4 but which has a switched capacitor connected to the outputs, the switches being constructed out of zero threshold voltage NMOS FETs.

DETAILED DESCRIPTION OF THE PREFERRED EMBODIMENT

FIG. 2 is a cross-sectional view showing a semiconductor substrate with NMOS and PMOS channels which will be formed into the NMOS and PMOS FETs on which the first ion implantation of the preferred embodiment of the present invention is done. FIG. 2 shows the p-well 20, the n-well 22, field oxide regions 24, 26, 28, 30 and 32, and gate oxide layers 34, 36, 38 and 40. Photoresist mask region 44 is placed over the top of the channels which are not desired to be implanted with boron ions. The threshold adjust implantation uses a commercially available ion implanter to implant boron ions at an energy typically in the range of 20 to 40 keV.

Looking at FIG. 2 region A, which will be an NMOS FET, is not masked by the photo resist mask but is implanted with a typical dose of $9.5 \times 10^{11}$ boron ions per $cm^2$. This implant raises the threshold voltage from the native threshold voltage to the normal threshold voltage. Region B, which will also be an NMOS FET, is masked during the first ion implantation step so no boron ions are implanted into the channel area. For this reason, the threshold voltage of the NMOS FET created in region B will be the native threshold voltage.

Regions C and D will both be PMOS FETs. Both regions C and D are not masked so an implant dose of typically $9.5 \times 10^{11}$ boron ions per $cm^2$ is made into regions C and D to raise the threshold voltage from the native threshold voltage to the normal PMOS threshold voltage.

FIG. 3 is a cross-section of the die shown in FIG. 2 after the additional step of removing the photo resist mask regions 42 and 44 and putting a new photo resist mask region 46 on top of regions A, B and C. A second ion implantation is done to unmasked region D. This second ion implantation should be in the range typically of $1.2 \times 10^{12}$ to $2 \times 10^{12}$ boron ions per $cm^2$ with a preferred ion implantation dose of $1.5 \times 10^{12}$ ions per $cm^2$. This additional implant dose to the channel in region D increases the threshold voltage from the normal threshold voltage to the zero threshold voltage which is substantially zero volts. PMOS FETs whose threshold voltages are substantially zero volts are called zero threshold voltage PMOS FETs in the following discussion. Zero threshold voltage PMOS FETs whose threshold voltages range substantially from −0.4 volts to 0.4 volts can be used. Preferably, however, the threshold voltages of the zero threshold voltage PMOS FETs range substantially from −0.3 volts to 0.3 volts. Even better are zero threshold voltage PMOS FETs whose threshold voltages range substantially from −0.2 volts to 0.2 volts. It is desired that the zero threshold voltage PMOS FETs' threshold voltages be made as close to zero volts as possible.

The native or unimplanted threshold voltage for PMOS FETs ranges substantially from −1.6 to −1.8 volts. The native or unimplanted threshold voltage for the NMOS FETs ranges substantially from −0.2 to 0.2 volts. Since for NMOS FETs the zero threshold voltage is also the native threshold voltage, the zero threshold voltage for NMOS FETs also ranges substantially from −0.2 to 0.2 volts.

The normal threshold voltage for the NMOS FETs ranges substantially from 0.6 to 1.1 volts. The normal threshold voltage for PMOS FETs ranges substantially from −0.6 to −1.1 volts.

In the two implantation steps discussed above, the amount of implant dose per $cm^2$ depends upon the gate oxide thickness. The implant doses given above are for a 1.2 micron process with a gate oxide thickness of around 250 angstroms. The threshold voltage also depends on the implant dosages of the p well and n well. In the preferred embodiment, the p-well 20 is defined on the semiconductor substrate by implanting the substrate and thermally driving the atoms to form a well of surface concentration on the order of $10^{16}$ boron atoms per $cm^3$. Additionally, n-well 22 is created on the semiconductor substrate by implanting the substrate on the order of $10^{16}$ arsenic and/or phosphorous atoms per $cm^2$.

Using the ion implantation steps shown in FIGS. 2 and 3, device A will be an NMOS FET with a normal threshold voltage. Device B will be an NMOS FET with a zero threshold voltage, since its channel is masked during both the first ion implantation and the second ion implantation. Device C will be a PMOS FET with a normal threshold voltage and Device D will be a PMOS FET with a zero threshold voltage.

Other ways to do the threshold implant are also possible. For example, it is possible to have individual threshold implantation steps for regions A, C, and D.

Implanting the PMOS FETs' channels to a level required to have a zero threshold voltage was previously considered impracticable. For the small transistor lengths of the present technology, as the PMOS FETs' threshold voltage is lowered by additional implantation of boron ions, the PMOS FET becomes more likely to punchthrough at normal operative voltages. Punchthrough is a condition where the depletion region moves completely over from the drain region to the source region so that a leakage current flows from the source to the drain. This leakage current is not controllable by the gate voltage. For PMOS FETs, the leakage current is in the sub microampere range for normal threshold voltages. However, it was known that when the PMOS FET was implanted sufficiently to have a threshold voltage around −0.6 volts, the PMOS FET had an increased leakage current so it was "softer" than the PMOS FET at −0.8 volts. For this reason, it was assumed that the softening of the PMOS FET would continue as the more boron ions were implanted in the channel in an additional implanting step to set the threshold voltage at the zero threshold voltage. The softening of the PMOS FET concerns the increased level of the leakage current in the PMOS FET. Due to the expectations of continued softening as the threshold voltage was decreased, one would not expect a PMOS FET with a low threshold voltage to be useful.

Contrary to expectations, when the PMOS FET channel region, region D, is implanted with the additional ion implantation of boron ions, the PMOS FET is not as "soft" as would be imagined. Normally, in a PMOS FET, holes are conducted through the channel in a region near the silicon dioxide layer. The holes being conducted through the channel often contact the silicon dioxide layer in a manner which causes a scattering of the holes. This scattering reduces the momentum of the holes during their conduction.

It has been found that when the PMOS FET's channel is implanted with an additional boron implantation, the boron ions are driven deeper into the channel region. For this reason, a subsurface conduction of holes occurs. This subsurface conduction of holes increases the conduction of the zero threshold voltage PMOS FETs since the holes that conduct in a subsurface manner do not scatter against the gate oxide layer. The subsurface conduction seems to occur a few hundred angstroms below the surface connection between the n-well and the gate oxide layer. Additionally, the subsurface conduction causes protection from premature breakdown. It has been found that the PMOS FETs with a zero threshold voltage do not have a high amount of leakage current. The characteristics of the PMOS FET with a zero threshold voltage is much less soft than would be expected if the correct combination of gate oxide thickness and channel implants is used, because the vertical gate field retards premature punch-through in the subsurface channel.

Additionally, it is now believed that due to the subsurface conduction of the holes in the zero threshold voltage PMOS FETs, the zero threshold voltage devices will have less 1/f (or flicker) noise than normal threshold voltage devices.

Additional steps to form the completed FET devices that occur before and after threshold adjust are known and include forming source and drain regions in the semiconductor substrate, forming polysilicon control gate electrodes, activation steps, and forming dielectric and interconnect layers.

The zero threshold voltage PMOS and NMOS FETs are most useful in analog or mixed analog/digital circuits. FIG. 4 is a circuit diagram of a folded cascode transconductance amplifier. The circuit has a positive phase input 100 and negative phase input 102. The positive phase and negative phase inputs which include a common mode bias voltage are sent to the gates of two zero threshold voltage PMOS FETs 104 and 106 which are the differential input pair. The cascode FETs 108 and 110 are normal threshold NMOS FETs.

The larger the bias voltage, $V_{gs}$-$V_T$, on PMOS FETs 106 and 104, the larger the available signal swing for a given amount of distortion or alternatively the lower the distortion for a given signal swing. The distortion of the signal is a function of the bias voltage over the signal swing. Typically, designers will try to keep the signal swing at $\frac{1}{2}$ to $\frac{1}{3}$ the bias voltage. The dynamic range is defined as the maximum input over the noise and distortion. By reducing the distortion, the dynamic range is increased. The use of a zero threshold device allows for a large dynamic range.

Since the FETs in the folded cascode transconductance amplifier are run in the saturation region, the equation for the drain current, $I_d$, through the PMOS FETs 106 and 104 is $I_d=(W/L)\beta(V_{gs}-V_T)^2$; the equation for the transconductance of the FET is $g_m=2(W/L)\beta(V_{gs}-V_T)$. $\beta$ is a constant that depends on the process. W and L stand for the width and effective length of the FET respectively.

It can be shown that the folded cascode transconductance amplifier has a parasitic pole at $\omega_p=g_{m110,108}/C_p$. For this reason, the cascode FETs 110 and 108 should be NMOS FETs because generally NMOS FETs have three times more mobility than PMOS FETs, and the parasitic capacitance of an NMOS FET is one half that of a PMOS FET for an N well process. The bandwidth of the transconductance amplifier, which is reduced by the parasitic pole, can be greatly increased if the NMOS FETs are the cascode FETs rather than if the PMOS FETs are the cascode FETs. The folded cascode transconductance amplifier requires complementary FETs as the differential input pair FETs and the cascode FETs. Since NMOS FETs are used as the cascode FETs for the circuit to have a higher bandwidth, PMOS FETs must be used as the differential input pair. For this reason, the ability to use PMOS FETs as the differential input pair allows for larger bandwidth circuits. The ability to use zero threshold FETs as the differential input pair allows for the larger linear range as discussed above. The current supplies 108, 112, 114, 116 and 118 are used for biasing the FETs of the folded cascode transconductance amplifier and thereby setting the transconductance of the FETs.

Additionally, for circuits with three volt power supplies, it may be necessary for zero volt threshold FETs to be the differential input pair in order for the common mode voltage at the input and output to be set and for the drops across the current source to be sufficient to allow for the biasing of the FETs. The bias voltage on the differential input pair of FETs needs to be equal to about 1 volt to have the desired low level of distortion of these FETs signals for a +/−0.15 volt signal swing as discussed above. Current source 108 requires about a 0.5 volt drop to work. If the threshold voltage, $V_T$, of the differential input FETs 106 and 104 is about 1 volt (normal threshold voltage), $V_{gs}$ of the differential input FETs would be about 2 volts. This would allow for only a 0.5 common mode voltage at the input requiring the same common mode voltage at the output. Since the cascode FETs 110 and 108 are run in the saturation region where $V_{ds}>(V_{gs}-V_T)$, the transconductance, $g_{m110,108}$, will be so low to have an unacceptably narrow bandwidth. If the threshold voltage, $V_T$, Of the differential input pair FETs 104 and 106 is reduced to 0 volts (zero threshold range), the input and output common mode bias can be greater at 1.3 volts for example and the transconductance, $g_{m110,108}$, and corresponding bandwidth will be acceptably high. Zero threshold voltage FETs can be used to maintain comparable signals with a 3 volt supply as the normal threshold voltage FETs with a 5 volt supply without degrading the bandwidth or increasing the distortion of the signal. Additionally, the zero threshold PMOS FETs can be used with voltage supplies less than 3 volts.

FIG. 5 is a circuit diagram of a switch circuit which is useful in a programmable capacitor array. A zero threshold voltage NMOS FET 130 is connected with its source 132 to an input and its drain 134 to an output to a capacitive load 136. The voltage placed at the gate 138 determines whether the switch is turned on or off, and therefore whether the capacitive load is connected to the input 132. As long as the gate voltage is below the bias voltage at the source 132, drain current $I_d$ does not flow from the source to the drain and the resistance of the FET 130 is very high. When the zero threshold voltage NMOS FET 130 is turned on, and the circuit shown in FIG. 5 is used as an integrator, there is a parasitic zero at $\omega=1/R_dC$. For this reason, when the FET 130 is turned on, the resistance of the FET 130 should be keep as low as possible. When the FET 130 is turned on by putting a high voltage at the gate, the FET 130 operates in the triode region, the resistance of the FET 130 is proportional to $1/(V_{gs}-V_T)$. As can be seen, the resistance of FET 130 is lowered when the threshold voltage, $V_T$, is lowered. This type of zero voltage NMOS FET can be used in many situations where a low resistance switch is desired. Depending on the situation, a zero voltage PMOS FET could also be used as a switch.

FIG. 7 shows such low resistance zero threshold voltage NMOS FETs 150 and 152 and a capacitor 154 connected to the transconductance amplifier of FIG. 4. The NMOS FETs switch on to form an integrator across the output. FIG. 7 shows both zero threshold NMOS and PMOS FETs in the same circuit.

FIG. 6 is a circuit diagram of a low offset source follower. A zero threshold NMOS FET 140 is connected with its gate attached to an input 142 and its source connected to an output 144 and to a current source 146 which acts to bias the circuit.

The voltage at output 144 of the low offset source follower is equal to the input voltage at 142, $V_{in}$, minus $V_{gs}$. The lower the threshold voltage, $V_T$, the lower $V_{gs}$ can be while keeping FET 140 on. When $V_T$ is around 0 volts, the output voltage at node 144 can be kept very close to the input voltage at node 142. This circuit has the benefit that since the input voltage is connected to the gate of an FET which has a very high impedance, a high impedance input signal can be sent out as a low impedance output signal. This is because the amount of the drain current, $I_d$, through the NMOS FET 140 can be made much higher than the leakage through the gate at 140.

The use of zero threshold PMOS and NMOS FETs is valuable with the normal 5 volt power supply in addition to the reduced 3 volt power supply. For example, switches for the switched capacitive devices can be useful in circuits with 5 volt power supplies. Additionally, the use of zero threshold FETs allows for a greater dynamic range due to reduced distortion at any supply voltage.

It is to be understood that the circuits of FIG. 4–6 can be part of a larger circuit containing both normal threshold PMOS and NMOS FETs formed in a semiconductor substrate. These circuits can be pure analog or mixed analog and digital.

Various details of the implantation and method are merely illustrative of the invention. It will be understood that various changes of details may be within the scope of the invention of the invention, which is to limited only by the appended claims.

What is claimed is:

1. A method of forming an integrated circuit including NMOS and PMOS FETs having channels on a semiconductor substrate, said method including a threshold adjust implantation for said channels comprising the steps of:

implanting at least some of said channels of said NMOS and PMOS FETs so that said at least some of said channels are implanted sufficiently to have a normal threshold voltage, said normal threshold voltage being in the range 0.6 to 1.1 volts for said NMOS FETs and −0.6 to −1.1 volts for said PMOS FETs;

thereafter, masking said channels except for certain of said PMOS FETs' channels, said at least some of the channels including said certain of said PMOS FETs' channels; and implanting said certain of said PMOS FETs' channels so that said PMOS FETs have a threshold voltage of −0.4 to 0.4 volts rather than said normal threshold voltage.

2. The method of claim 1, wherein the implanting step includes implanting said PMOS FETs' channels to a threshold voltage of −0.3 to 0.3 volts.

3. The method of claim 1, wherein the implanting step includes implanting said PMOS FETs' channels to a threshold voltage of −0.2 to 0.2 volts.

4. The method of claim 1 further comprising an additional step of masking at least one of the channels of said NMOS FETs before said first implanting step so that said at least one of the channels of said NMOS FETs is not implanted in said first implanting step and therefore said at least one of said channels of said NMOS FETs has a threshold voltage of −0.2 to 0.2 volts.

5. The method of claim 1 wherein said implanting step includes implanting with boron ions.

6. A method of forming an integrated circuit including NMOS and PMOS FETs having channels on a semiconductor substrate, said method including a threshold adjust implantation for said channels comprising the steps of:

masking the channels of the NMOS and PMOS FETs except for some of said channels of the NMOS and PMOS FETs in a first masking step;

implanting said some of the channels of said NMOS and PMOS FETs so that said some of the channels are implanted sufficiently to have a normal threshold voltage, said normal threshold voltage being in the range 0.6 to 1.1 volts for said NMOS FETs and −0.6 to −1.1 volts for said PMOS FETs;

masking said channels except for certain of said PMOS FETs' channels, said certain of Said PMOS FETs channels being masked in said first masking step; and implanting said certain of said PMOS FETs' channels so that said PMOS FETs have a threshold voltage of −0.4 to 0.4 volts.

7. The method of claim 6, wherein the implanting step includes implanting said PMOS FETs' channels to a threshold voltage of −0.3 to 0.3 volts.

8. The method of claim 7, wherein the implanting step includes implanting said PMOS FETs' channels to a threshold voltage of −0.2 to 0.2 volts.

9. A method of forming an integrated circuit including NMOS and PMOS FETs having channels on a semiconductor substrate, said method comprising the steps of:

forming NMOS and PMOS FETs on the integrated circuit, the NMOS and PMOS FETs having the normal threshold range of 0.6 to 1.1 volts for said NMOS FETs and −0.6 to −1.1 volts for said PMOS FETs; and forming additional NMOS FETs and PMOS FETs on the integrated circuit, the additional NMOS FETS and PMOS FETs having a threshold voltages outside the normal threshold voltage range, at least some of the additional NMOS FETs and the additional PMOS FETs having threshold voltages closer to zero volts than the normal threshold voltage FETs.

10. The method of claim 9, wherein the normal threshold voltage NMOS and PMOS FETs forming step comprises implanting the channels of the normal threshold voltage PMOS and NMOS in a first threshold implant.; and wherein the additional NMOS FETs and PMOS FETs forming step comprises a second threshold implant to the some of the additional PMOS FETs channels.

11. The method of claim 10, wherein the first threshold implant implants the some of the additional PMOS FETs' channels.

12. The method of claim 10, wherein the some of the additional NMOS FETs' channels are masked during the first and second threshold implant.

* * * * *